United States Patent
Jones et al.

(10) Patent No.: US 6,615,510 B2
(45) Date of Patent: Sep. 9, 2003

(54) WAFER DRYING APPARATUS AND METHOD

(75) Inventors: Oliver David Jones, Watsonville, CA (US); Kenneth C. McMahon, Morgan Hill, CA (US); Jonathan E. Borkowski, Sunnyvale, CA (US); Scott Petersen, Scotts Valley, CA (US); Donald E. Stephens, Santa Cruz, CA (US); Yassin Mehmandoust, Santa Cruz, CA (US); James M. Olivas, Scotts Valley, CA (US)

(73) Assignees: Lam Research Corporation, Fremont, CA (US); Oliver Design, Inc., Scotts Valley, CA (US)

( * ) Notice: Subject to any disclaimer, the term of this patent is extended or adjusted under 35 U.S.C. 154(b) by 0 days.

(21) Appl. No.: 10/230,846

(22) Filed: Aug. 28, 2002

(65) Prior Publication Data

US 2003/0000102 A1 Jan. 2, 2003

Related U.S. Application Data

(63) Continuation of application No. 09/579,841, filed on May 26, 2000, now Pat. No. 6,446,355.
(60) Provisional application No. 60/136,635, filed on May 27, 1999.

(51) Int. Cl.[7] .................................................. F26B 3/00
(52) U.S. Cl. .............................. 34/448; 34/348; 34/630; 34/218; 34/444; 34/487
(58) Field of Search ........................ 34/218, 219, 220, 34/229, 444, 448, 497, 467, 487, 472, 348; 118/715, 724, 725

(56) References Cited

U.S. PATENT DOCUMENTS

| 4,573,851 A | 3/1986 | Butler |
|---|---|---|
| 4,611,966 A | 9/1986 | Johnson |
| 4,856,544 A | 8/1989 | McConnell |
| 4,955,402 A | 9/1990 | Miranda |
| 5,022,961 A * | 6/1991 | Izumi .......................... 438/74 |
| 5,331,987 A | 7/1994 | Hayashi et al. |
| 5,352,636 A * | 10/1994 | Beinglass ..................... 438/47 |
| 5,369,891 A | 12/1994 | Kamikawa |

(List continued on next page.)

FOREIGN PATENT DOCUMENTS

| EP | 0 328 746 | 8/1989 |
|---|---|---|
| EP | 0855736 A2 | 7/1998 |
| JP | 01022030 | 1/1989 |
| JP | 64-22030 | 1/1989 |
| JP | 06267923 | 9/1994 |
| JP | 6-267923 | 9/1994 |
| JP | 09115871 | 5/1997 |
| JP | 9-115871 | 5/1997 |
| JP | 09-240776 | 9/1997 |
| JP | 09240776 | 9/1997 |
| JP | 10303166 | 11/1998 |
| JP | 10-303166 | 11/1998 |
| JP | 11-40535 | 2/1999 |
| JP | 11040535 | 2/1999 |

Primary Examiner—Denise L. Esquivel
Assistant Examiner—Kathryn S. O'Malley
(74) Attorney, Agent, or Firm—Martine & Penilla, LLP

(57) ABSTRACT

Liquid is removed from wafers for drying a wafer that has been wet in a liquid bath. The wafer and the bath are separated at a controlled rate as the wafer is positioned in a gas-filled volume. The controlled rate is generally not less than the maximum rate at which a meniscus will form between the liquid bath and the surface of the wafer when the liquid bath and the wafer are separated. The gas-filled volume is defined by a hot chamber that continuously transfers thermal energy to the wafer in the gas-filled volume. Hot gas directed into the volume and across the wafer and out of the volume continuously transfers thermal energy to the wafer.

19 Claims, 10 Drawing Sheets

U.S. PATENT DOCUMENTS

| | | |
|---|---|---|
| 5,520,744 A | 5/1996 | Fujikawa et al. |
| 5,671,764 A | 9/1997 | Murakami et al. |
| 5,704,493 A | 1/1998 | Fujikawa et al. |
| 5,727,578 A | 3/1998 | Matthews |
| 5,807,439 A | 9/1998 | Akatsu et al. |
| 5,884,640 A | 3/1999 | Fishkin et al. |
| 5,902,402 A | 5/1999 | Durst et al. |
| 5,913,981 A | 6/1999 | Florez |
| 6,021,791 A | 2/2000 | Dryer et al. |
| 6,045,624 A | 4/2000 | Kamikawa et al. |
| 6,095,167 A | 8/2000 | Florez |
| 6,108,932 A | 8/2000 | Chai |
| 6,158,141 A | 12/2000 | Asada et al. |
| 6,216,709 B1 | 4/2001 | Fung et al. |
| 6,430,841 B1 | 8/2002 | Borkowski et al. |

* cited by examiner

1. OPEN HATCH
2. LOAD WET WAFER(S)
3. PROCESS WAFER(S)
4. REMOVE HATCH
5. REMOVE DRY WAFER(S)

PROCESS CONTROL

WAFER DRYING APPARATUS AND METHOD

CROSS REFERENCE To RELATED APPLICATION

This application is a Continuation Application of co-pending prior Application No. 09/579,841 filed on May 26, 2000, now U.S. Pat. No. 6,446,355 (herein the "Parent Application"), the disclosure of which is incorporated herein by reference. The Parent Application claims priority from U.S. Provisional patent application No. 60/136,635 filed May 27, 1999, and entitled "Next Generation Modular Disk Cleaning System Including Transfer, Immersion, Cascade Brush Scrubber and Dryer Assemblies" (the "Provisional Application"). The Provisional Application is herein incorporated by reference.

BACKGROUND OF THE INVENTION

1. Field of the Invention

The present invention relates generally to removing liquid from wafers, and more particularly to apparatus and methods for drying a wafer that has been wet in a liquid bath, after which the wafer and the bath are separated at a controlled rate to form a thin layer of liquid on the wafer as the wafer is positioned in a gas-filled volume, wherein the volume is defined by a hot chamber that continuously transfers thermal energy to the wafer in the volume, and wherein hot gas directed into the volume and across the wafer and out of the volume continuously transfers thermal energy to the wafer, so that the thermal energy transferred to the wafer in the volume evaporates the thin layer from the wafer without decreasing the rate of separation of the wafer and the bath below a maximum rate of such separation at which a meniscus will form between the bath and the surface of the wafer during such separation.

2. Description of the Related Art

In the manufacture of semiconductor devices, process chambers are interfaced to permit transfer of wafers between the interfaced chambers. Such wafer transfer is via transport modules that move the wafers, for example, through slots or ports that are provided in the adjacent walls of the interfaced chambers. For example, transport modules are generally used in conjunction with a variety of wafer processing modules, which may include semiconductor etching systems, material deposition systems, flat panel display etching systems, and wafer cleaning systems. Due to growing demands for cleanliness and high processing precision, there has been a greater need to reduce the amount of human interaction during, between, and after such processing steps. This need has been partially met with the implementation of vacuum transport modules which operate as an intermediate wafer handling apparatus (typically maintained at a reduced pressure, e.g., vacuum conditions). By way of example, a vacuum transport module may be physically located between one or more clean room storage facilities where wafers are stored, and multiple wafer processing modules where the wafers are actually processed, e.g., etched or have deposition performed thereon, or cleaned. In this manner, when a wafer is required for processing, a robot arm located within the transport module may be employed to retrieve a selected wafer from storage and place it into one of the multiple processing modules.

Despite use of such intermediate wafer handling apparatus, it is still necessary to clean and dry the wafers at the completion of such processing. As an example, after the wafers have been cleaned, the wafers may have a non-uniform coating of liquid. A wafer with such non-uniform coating of liquid, or with one or more drops of liquid thereon, or with any liquid thereon in any physical form, may be said to be "wet". In contrast, a wafer having a uniform coating of liquid may be said to be "uniformly wet".

In the past, annular-shaped pieceparts other than wafers have been subjected to a drying operation. After cleaning and while wet, such pieceparts have been placed in a tank containing a bath of hot liquid. In one type of drying operation, the hot liquid has been drained from the tank at a rate such that a thin layer of liquid, rather than one or more drops of liquid, forms on that portion of such piecepart that is out of the draining liquid. The thin layer has been preferred over one or more drops because a drop of liquid has a high volume, e.g., from about 0.001 ml. to about 0.020 ml. In comparison to the drop, a thin layer of liquid on a wafer such as a 200 mm. diameter wafer, may only have a volume at the maximum diameter of about 0.133 of 0.0105 ml., which is the middle of the above volume range of the drop, for example. Evaporation of a drop generally results in the concentration of small particles at the last small point at which the drop exists. When the piecepart is a wafer, such concentration may result in defects in a chip made from the wafer.

To remove the thin layer from such piecepart, reliance has been placed on the thermal energy stored in such piecepart to provide the thermal energy necessary to evaporate the thin layer. However, when such pieceparts are "wafers", as defined above, problems have been experienced in not properly drying the thin layer from the wafer. For example, it appears that using only such stored thermal energy, the thin layer evaporates from the wafer at a rate less than the maximum rate of separation of the liquid bath and the wafer at which a meniscus will form between the liquid bath and the surface of the wafer during such separation. Thus, the rate at which the liquid is drained from the tank has to be decreased to match the rate of evaporation. Alternatively, the wafer would have to be retained in the tank after the draining has been completed. Each of such decreased rate of draining and such retaining increases the time required to dry the wafer, which increases the cost of fabricating devices based on the wafer.

In view of the forgoing, what is needed is apparatus and methods of efficiently drying wafers. Such efficient drying should allow the wafers and the liquid to be separated at a rate no less than the maximum rate of separation of the liquid and the wafer at which a meniscus will form between the liquid bath and the surface of the wafer. Also, the efficient drying should rapidly remove from the wafer a thin layer of liquid that forms on the wafer as the wafer and the bath are separated, wherein "rapidly" means such removal occurs before the wafer and the bath have been completely separated e.g., separated by about 0.004 inches.

SUMMARY OF THE INVENTION

Broadly speaking, the present invention fills these needs by providing apparatus and methods of efficiently removing fluid from wafers. The efficient removing is attained by providing apparatus and methods for drying a wafer that has been uniformly wet in a fluid bath, in which the wafer and the bath are separated at a controlled rate to form a thin layer of fluid on the wafer as the wafer is positioned in a gas-filled volume. In addition to such separation, the efficient removing is attained by defining the gas-filled volume by use of a hot chamber that continuously transfers thermal energy to the wafer in the volume. Further, hot gas directed into the volume and across the wafer and out of the volume continuously transfers thermal energy to the wafer. The directing of the gas out of the volume is independent of the separation of the bath and the wafer. The thermal energy transferred to the wafer in the volume evaporates the thin layer from the wafer without decreasing the rate of separation of the wafer and the bath below the maximum rate of such separation at which a meniscus will form between the bath and the surface of the wafer during such separation. In addition to such separation and directing of the hot gas across the wafer and out of the volume, the relative humidity in the volume is kept low to inhibit recondensation of the fluid on the wafers, for example.

Such efficient removal enables the wafer throughput of such apparatus and method to be limited only by the type of wafer that is being dried, and the type of fluid used to wet the wafer. For example, the characteristics of particular types of wafers and fluid dictate the maximum rate of such separation of the wafer and the bath at which a meniscus will form between the bath and the surface of the wafer during such separation and the wafer will be uniformly wet.

In one embodiment of the present invention a wafer drying system may include a bath enclosure configured to hold a fluid so that the fluid defines a top fluid surface. A temperature and humidity-controlled chamber may also be defined above the fluid surface. The chamber has a first opening at a first side proximate to the fluid surface and a second opening at a second side that is opposite to the first side.

In another embodiment of the present invention the wafers to be dried have opposite sides, and apparatus for drying the wafers may include a bath containing hot liquid, wherein the liquid defines an upper surface. Also provided is an enclosure having an inlet spaced from the upper surface and an outlet adjacent to the upper surface. The enclosure defines a continuous gas flow path from the inlet to the outlet, the flow path extending from the inlet along the upper surface and through the outlet. A heat transfer unit may supply hot gas to the inlet, with the hot gas being under pressure so as to flow in the continuous flow path. The heat transfer unit may transfer thermal energy to the enclosure so that the enclosure radiates thermal energy across the continuous flow path. A wafer carrier may be movable in the bath and in the enclosure for moving the wafer at a controlled rate out of the bath and into intersection with the continuous flow path. The rate may be controlled so that as the wafer moves out of the bath a thin layer of the liquid is formed on each of the opposite sides of the wafer. As the wafer intersects the continuous flow path thermal energy from the hot gas and from the enclosure is received by the wafer and by the thin layer. The received thermal energy evaporates the thin layer off the opposite sides of the wafer.

In a related embodiment, the walls of the enclosure may define a perimeter of the enclosure. A plenum surrounds the perimeter of the enclosure for receiving the gas and the evaporated thin layer from the outlet. To assure that the flow path remains continuous and to control the relative humidity in the enclosure, a fan is provided for exhausting the gas, the evaporated thin layer, and vapor from the bath from the plenum. In a further embodiment, apparatus provided for drying a wafer having opposite planar sides may include a bath for containing a fluid having an upper surface. A heat transfer chamber may have a plurality of walls, each of the walls having a bottom at generally the same level as the level of adjacent ones of the walls. The chamber defines a wafer drying volume above the bottoms of the walls and within which a wafer drying path extends. At least one of the walls is provided with a gas inlet positioned opposite to the bottom. A support may suspend the chamber above the bath with the wafer drying path starting adjacent to the fluid surface and extending to a point adjacent to the gas inlet. The support positions the bottoms of the chamber walls spaced from the liquid surface to define an elongated outlet extending around the wafer drying path. A hot gas supply may be connected to the gas inlet for flowing hot gas through the chamber across the opposite planar sides of the wafer and out of the chamber through the elongated outlet to continuously transfer thermal energy at a selected temperature across the wafer drying path, and thus to the wafer and the thin film on the wafer. A heater connected to the chamber between the gas inlet and the elongated outlet may radiate thermal energy across the wafer drying path, and also to the wafer and the thin film on the wafer.

In a still other embodiment, a method for drying a wafer may include an operation of introducing a wafer being in a wet state into a fluid bath. The wafer is removed from the fluid bath at a controlled rate along a selected path. Heated gas is applied to the wafer as the wafer is moved along the selected path and out of the fluid bath. Advantageously, the applied heated gas flows in at least one continuous flow path to the wafer without recirculating the heated gas to the wafer. In this manner, the applied heated gas transitions the wafer to a dry state as the wafer exits the fluid bath. A related feature is that thermal energy is radiated onto the wafer as the wafer moves along the selected path out of the fluid bath. In another related aspect of this method embodiment, an enclosure is provided to define the at least one continuous flow path. The applying of the heated gas may include flowing hot nitrogen in the at least one continuous flow path across the wafer to effect the transition by evaporating the fluid from the wafer into the hot nitrogen. The applying operation then removes the hot nitrogen and the evaporated fluid from the enclosure and away from the fluid bath. In this manner, the hot nitrogen and the evaporated fluid are not recirculated in the enclosure, such that the evaporated fluid does not accumulate, which accumulation would reduce the rate at which the evaporation takes place and foster recondensation of the fluid on the wafers.

In yet another embodiment of the present invention a method for drying a wafer may cause a wafer to be immersed in a fluid bath to wet opposite sides of the wafer with the fluid. Then the wafer is moved out of the fluid bath into a defined volume along a selected path. The moving may be controlled to allow a meniscus on each of the opposite sides to form and leave a thin film of the fluid on the opposite sides of the wafer as the wafer moves from the fluid bath. By directing radiant energy into the thin film of the fluid on the opposite sides of the wafer, and by flowing heated gas into the defined volume and along the wafer as the wafer is moved along the selected path out of the fluid bath, the thin film of the fluid is evaporated from the wafer and combines with the heated gas flowing along the wafer. An exit from the defined volume is provided for the combined removed thin film of the fluid and the gas. Advantageously, the combination of the radiant energy, the heated gas and the exit promote rapid evaporation of the thin film and foster a decrease in the time required to dry the wafers.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention is described for drying wafers. The invention is described in terms of apparatus for and methods of efficiently removing liquid from wafers. More particularly, the invention is described in respect to apparatus and methods for removing liquid from a wafer to dry the wafer after the wafer has been wet in a liquid bath. The removing of the liquid is initiated as the wafer and the bath are separated at a controlled rate to uniformly wet the wafer, i.e. to form a thin layer of liquid on a portion of the wafer that is out of the bath and in a hot-gas-filled volume defined by a hot chamber. The hot chamber and the hot gas continuously transfer thermal energy to the wafer and the thin layer as the wafer enters the volume. The removing of the liquid is completed as the wafer enters the volume, in that the thermal energy transferred to the wafer and to the thin layer rapidly evaporates the thin layer from the wafer. The evaporation is at a high enough rate that there is no decrease in the rate of separation of the wafer and the bath below the maximum rate of such separation at which a meniscus and the thin layer will form between the bath and the surface of the wafer during such separation. By controlling the relative humidity in the hot chamber, recondensation of the evaporated thin layer and condensation of vapor from the bath onto the wafer are inhibited. It will be obvious, however, to one skilled in the art, that the present invention may be practiced without some or all of these specific details. In other instances, well known process operations have not been described in detail in order not to obscure the present invention.

Figure 1:
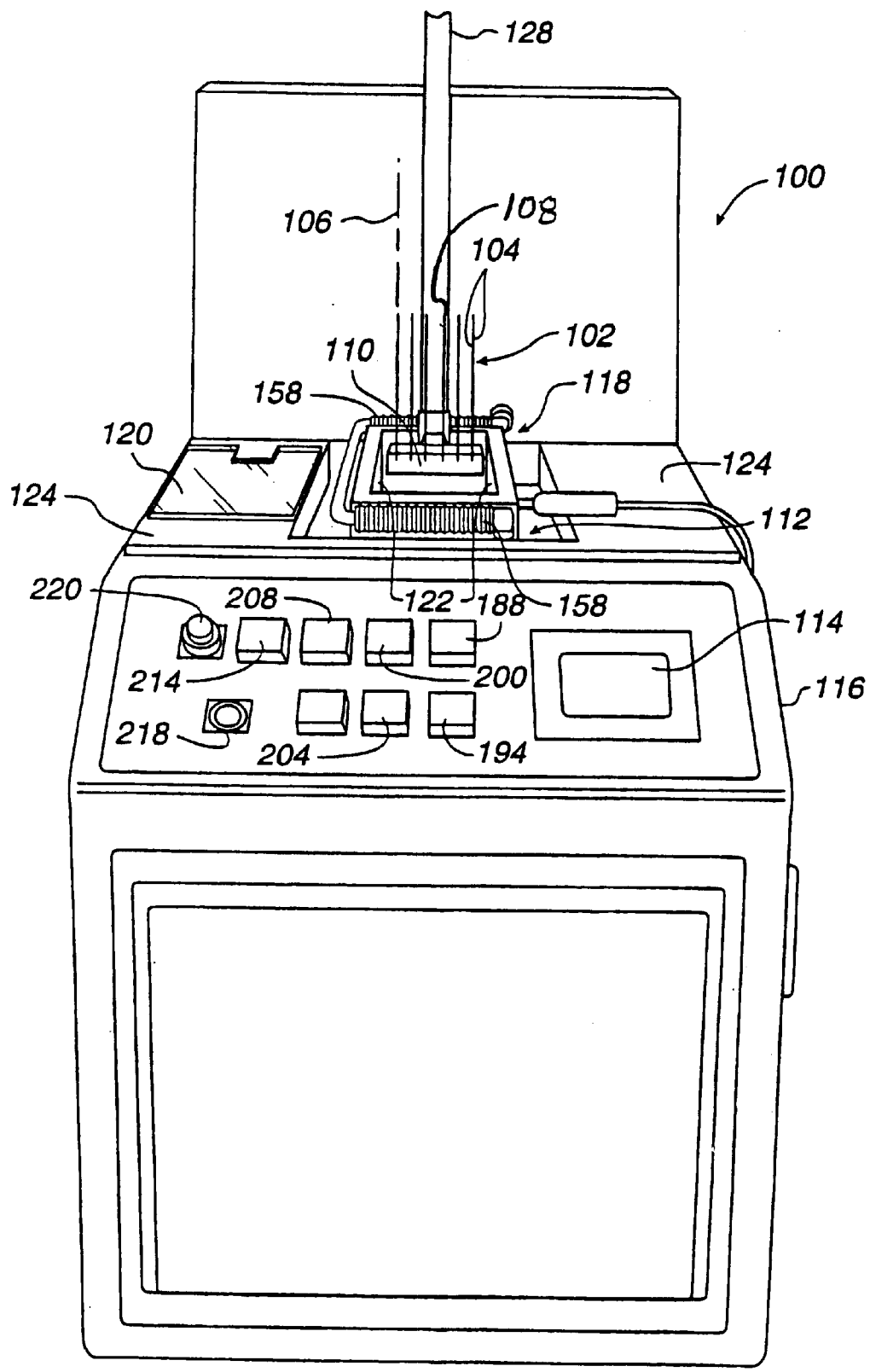
FIG. 1 depicts an apparatus for drying wafers according to the present invention, wherein a wafer carrier removes the wafers from a fluid-filled bath under the control of an operating panel.
Figure 2:
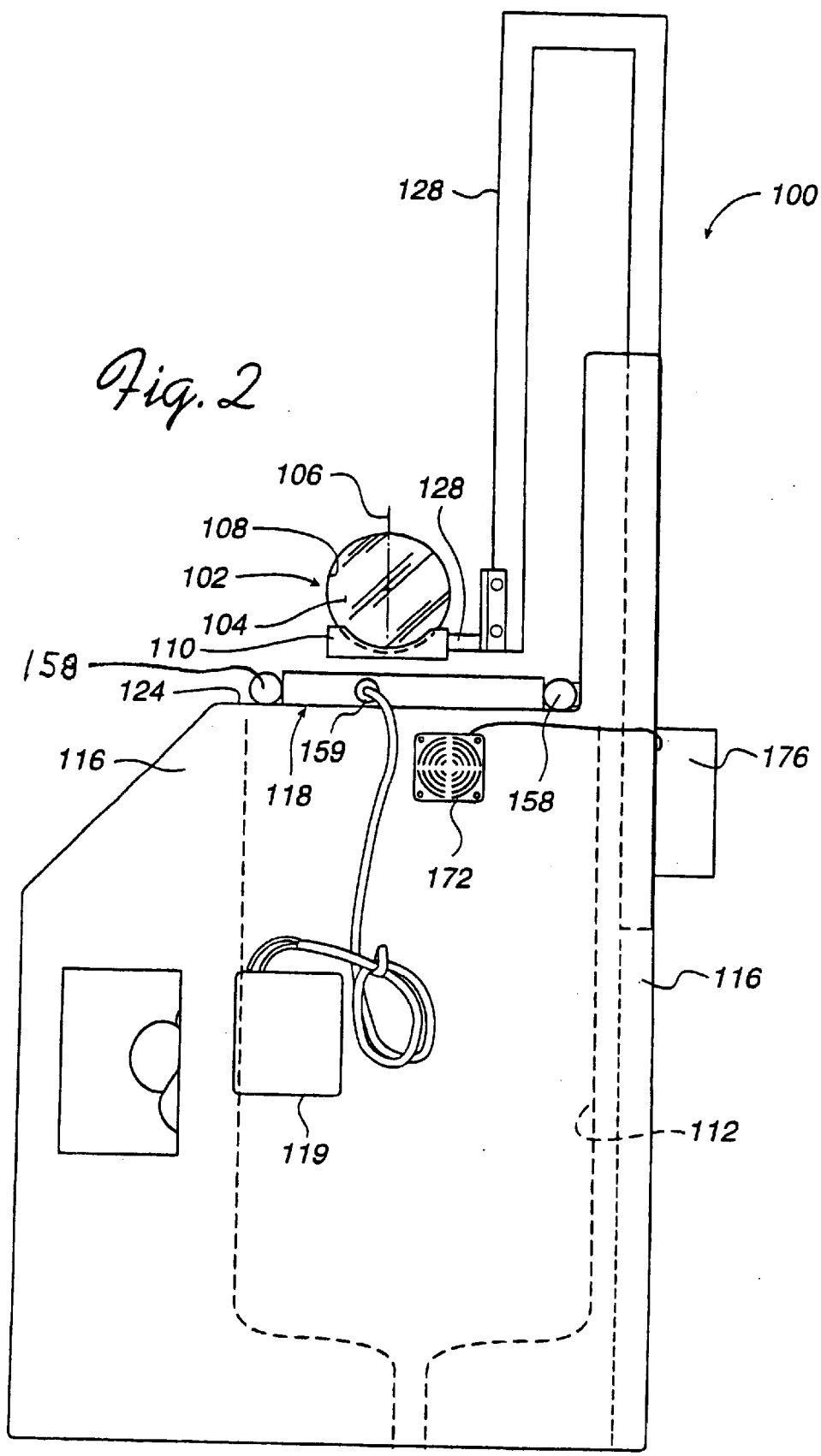
FIG. 2 is a side elevational view of the apparatus shown in FIG. 1, in which the carrier is shown removing a dry wafer from a drying enclosure mounted above the bath.

FIG. 1 depicts an apparatus 100 for drying wafers 102 according to the present invention. The wafers 102 may be of various diameters, such as two hundred mm. or three hundred mm., for example. Each wafer 102 has opposed flat or planar sides 104 extending parallel to a wafer axis 106, and an edge 108 between the sides 104. To facilitate drying of the wafer 102, or drying many wafers 102, a wafer carrier 110 is provided for removing the one or more wafers 102 from a bath 112 under the control of an operating, or process control, panel 114 mounted on a housing 116. FIG. 2 illustrates the apparatus 100, and depicts the carrier 110 removing a dry wafer 102 from a drying enclosure or chamber 118 mounted above the bath 112. An anti-static device 119 assures that no static charge exists in the enclosure 118.

Figure 3A:
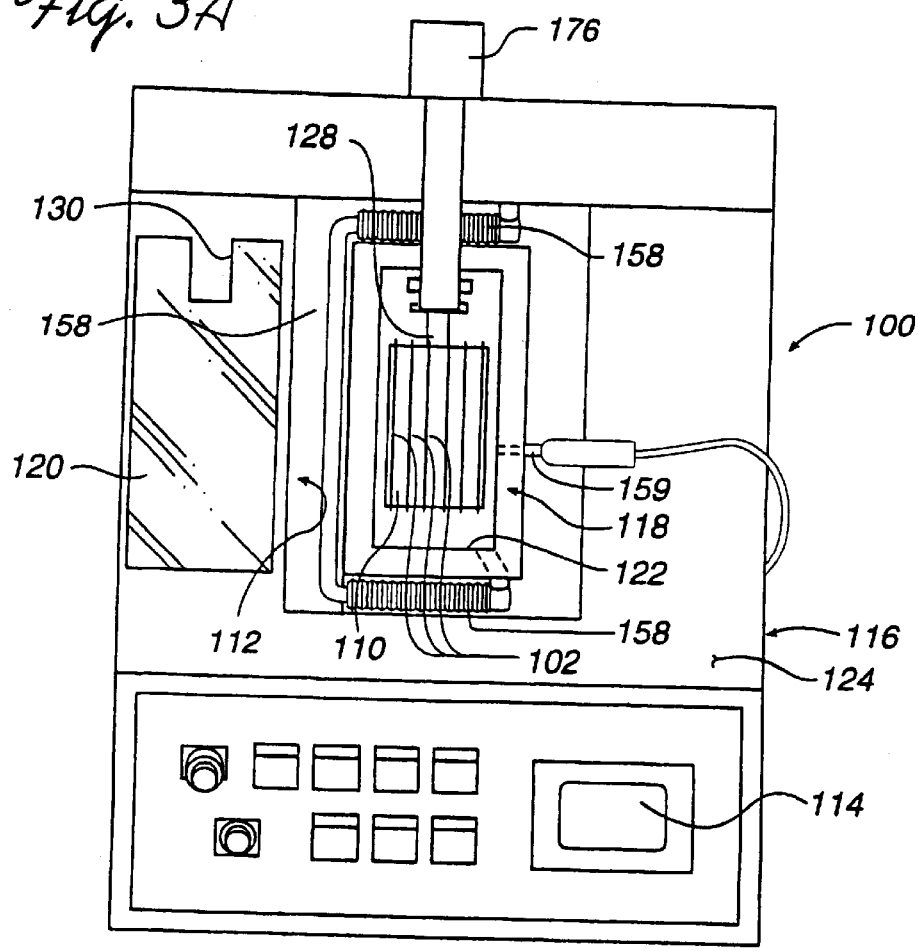
FIG. 3A is a plan view of the apparatus shown in FIGS. 1 and 2 showing a hatch above the bath for covering the drying enclosure during a drying operation.
Figure 3B:
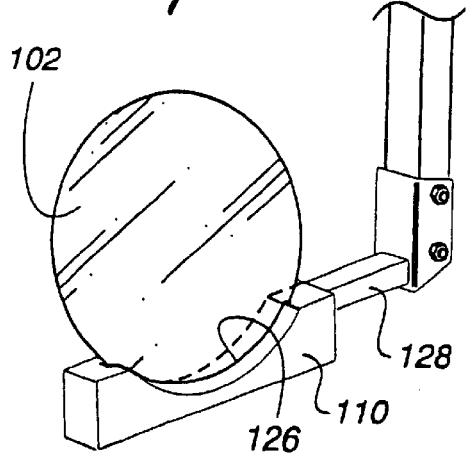
FIG. 3B is a view of a carrier for moving one wafer.
Figure 3C:
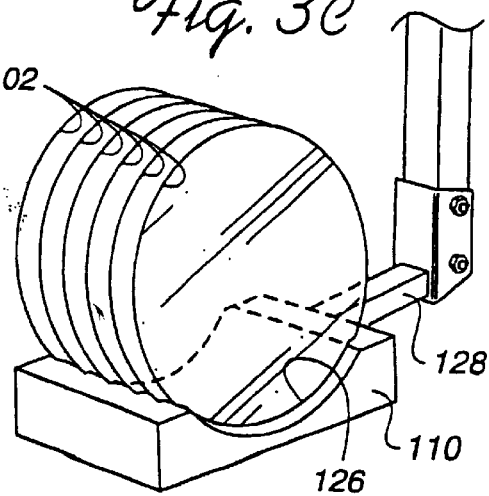
FIG. 3C is a view of a carrier for moving many wafers.

FIG. 3 shows the apparatus 100 in plan view as including a hatch or cover 120 that closes the drying enclosure 118 during a wafer drying operation. An opening 122 in a top panel 124 of the enclosure 118 is closed by the hatch 120, which is removable to allow access to the interior of the enclosure 118. FIGS. 3B and 3C show that the carrier 110 is provided with one or more grooves 126 to hold the wafers 102 in position for a drying operation. Each groove 126 holds one wafer 102 on the edge 108, i.e., in a vertical position with each opposite side 104 and the wafer axis 106 extending vertically. When the hatch 120 covers the opening, an arm 128 secured to the carrier 110 extends through a port 130 in the hatch 120 to facilitate moving the carrier 110, and a wafer or wafers 102 carried in the carrier 110, within the bath 112 and the gas-filled enclosure 118 along a wafer drying path 132 (FIG. 4B).

Figure 4A:
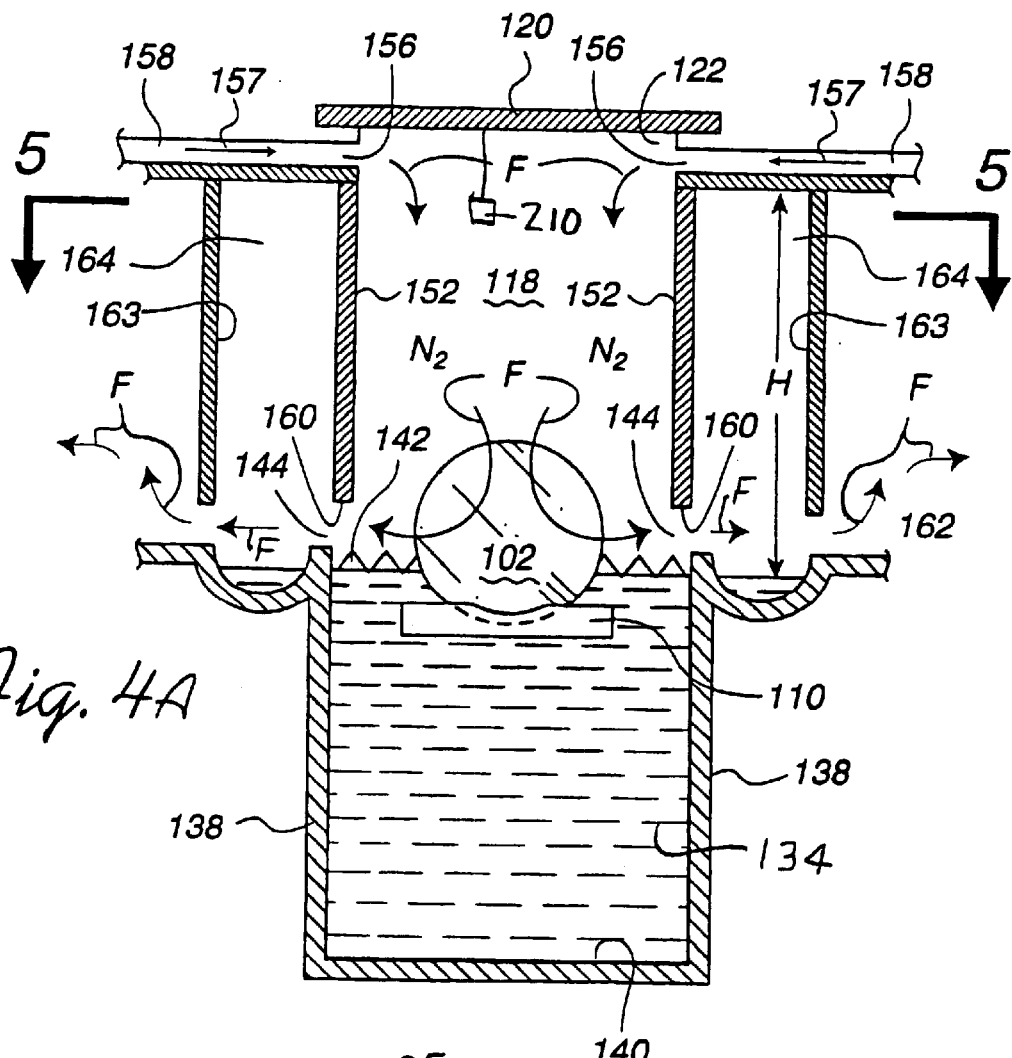
FIG. 4A is a schematic side elevational view of the apparatus for drying wafers showing the bath containing a fluid having an upper surface that is below opposite walls of the enclosure, wherein the walls are provided with gas inlets and with an outlet for the gas and fluid evaporated from the wafer.
Figure 4B:
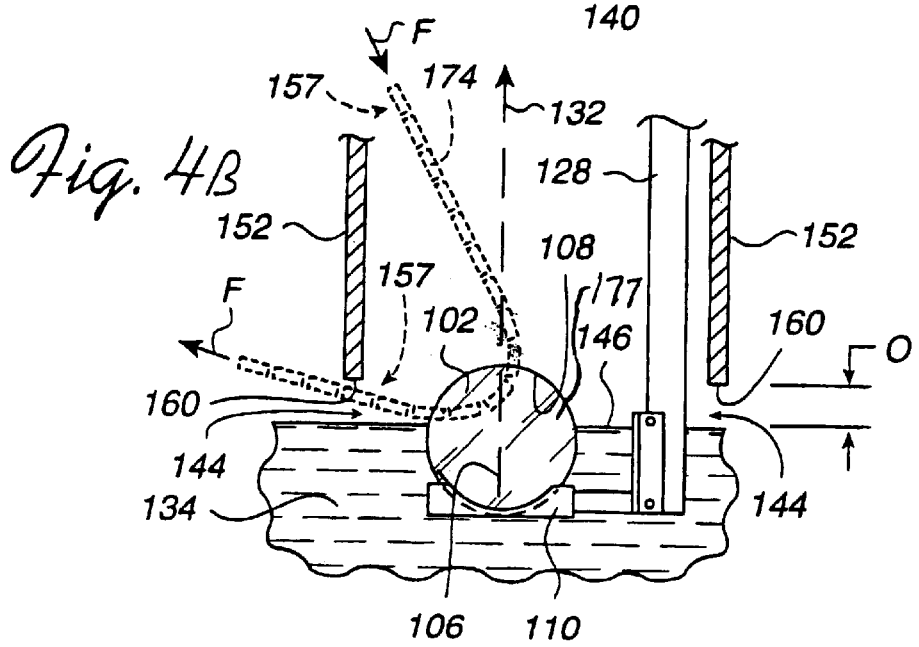
FIG. 4B is a schematic elevational view of the apparatus showing the carrier moving a wafer from the bath into a continuous flow of heated gas.
Figure 5:
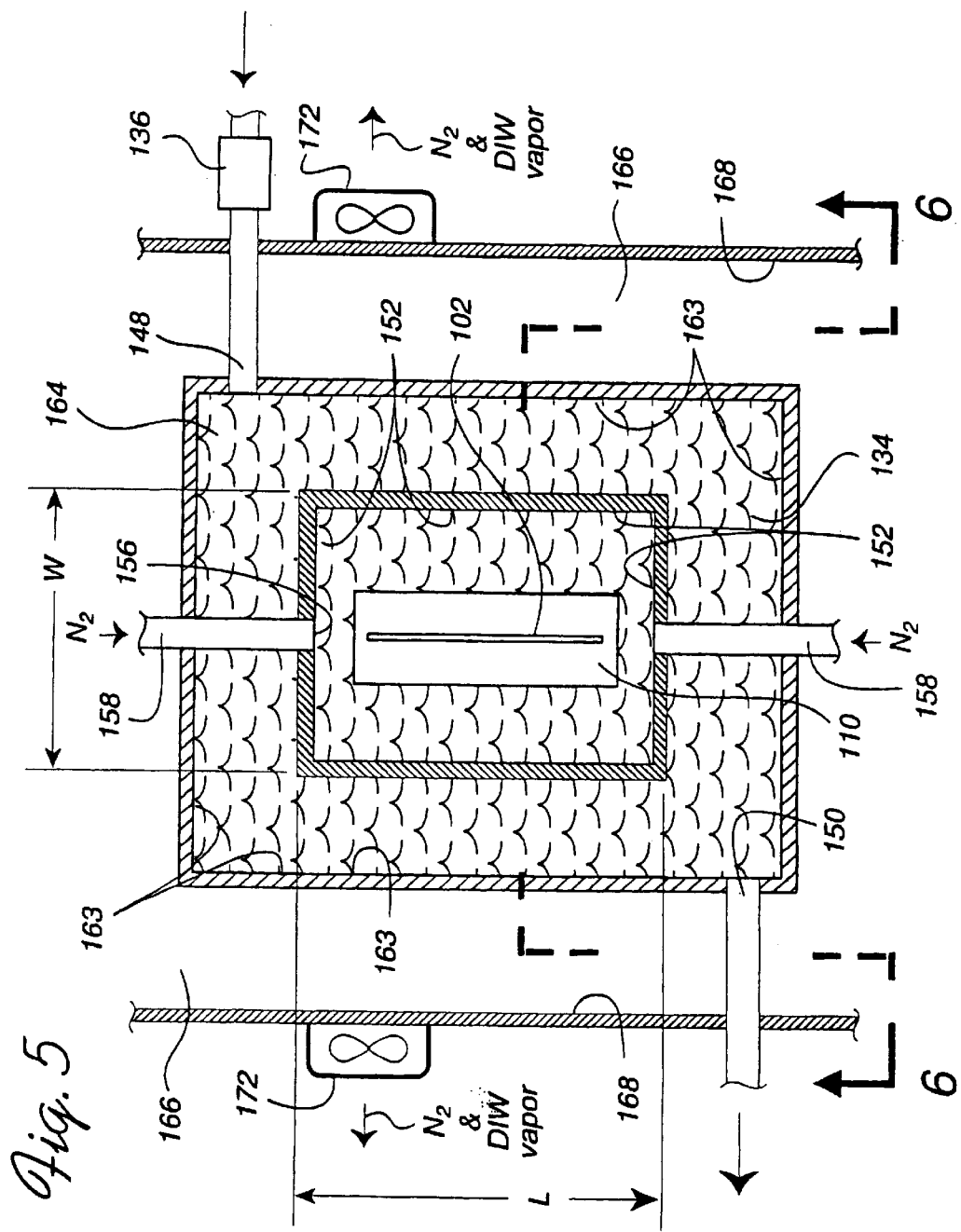
FIG. 5 is a schematic plan view taken along line 5—5 in FIG. 4A, showing a plenum into which the gas and the evaporated fluid flow from the outlet of the enclosure.
Figure 6:
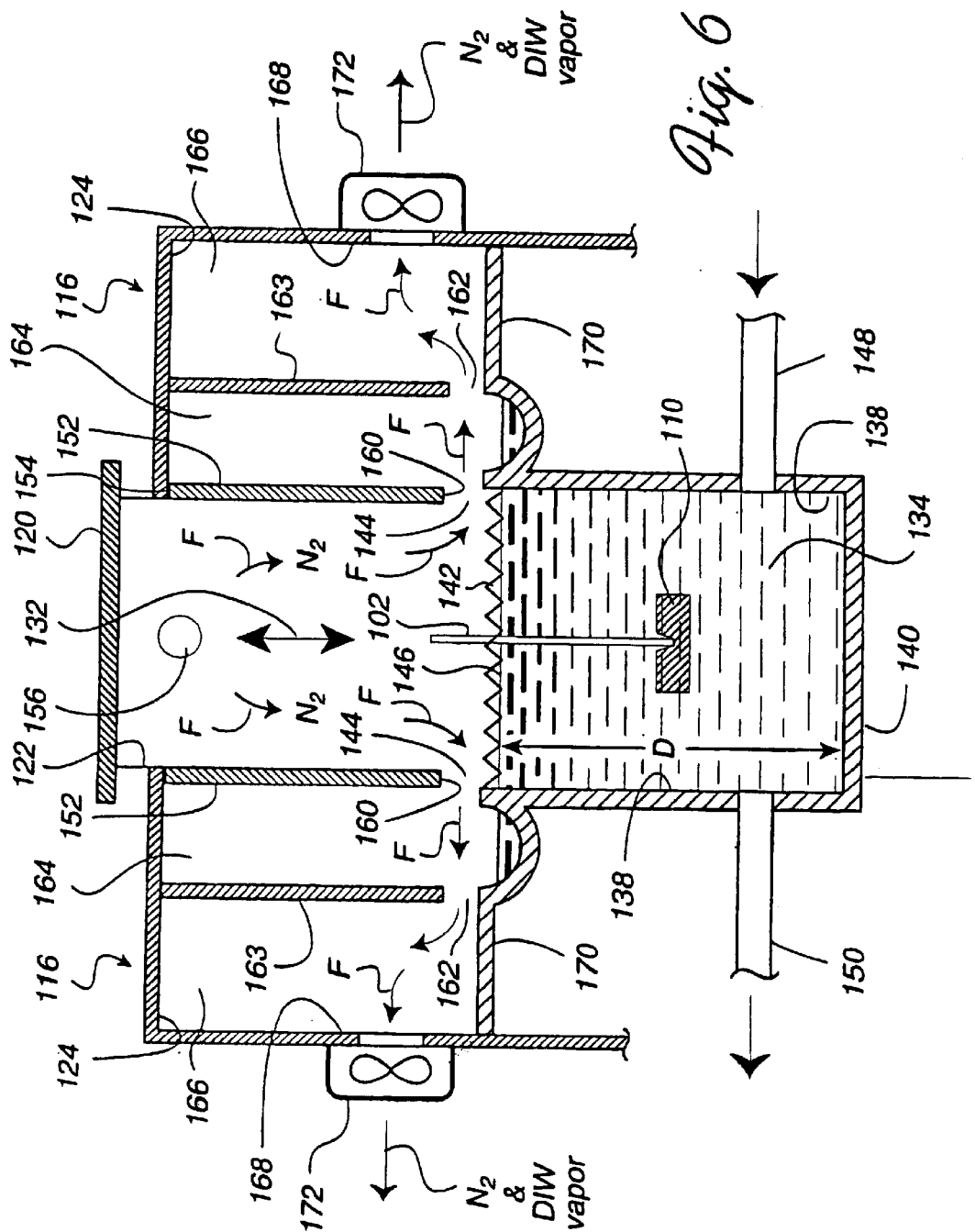
FIG. 6 is a schematic side elevational view of the apparatus viewed along line 6—6 in FIG. 5 showing the continuous flow of heated gas in the enclosure, wherein the continuous flow is onto the wafer and out of the enclosure.

FIGS. 4A, 5 and 6 schematically show that the bath 112 contains a fluid 134 such as water. Preferably, the water 134 is de-ionized. More preferably, the water 134 is both de-ionized and filtered. Most preferably, the water 134 is both de-ionized and passed through a very fine filter 136, and heated, before flowing into the bath 112. The filter 136 may be a 0.05 micron PTFE filter made by Pall Corporation. The filter 136 is designed to remove substantially all of the particles (not shown) from the fluid 134, and typically leaves in the fluid 134 less than five particles greater than or equal to 0.03 microns per cubic centimeter of the filtered fluid 134.

Four walls 138 and a bottom 140 of the bath 112 are located under the housing 116. A top 142 of each wall 138 of the bath 112 is vertically spaced from the housing 116 to define a primary gas outlet 144. An upper surface 146 of the fluid 134 in the bath 112 is spaced from the housing 116. The depth D of the fluid 134 from the upper surface 146 to the bottom 140 of the bath 112 is such that with the carrier 110 adjacent to the bottom 140 of the bath 112, the wafer(s) 102 on the carrier 110 may be fully immersed in the bath 112.

That is, with such depth D, the fluid 134 will entirely cover the wafer(s) 102 and thus initially provide a uniform coating of fluid 134 on each wafer 102. A fluid inlet 148 and a fluid outlet 150 are provided to enable the filtered and heated fluid 134 to be circulated into the bath 112 and then out of the bath 112 for heating, filtering and return to the bath.

The enclosure 118 is defined by two pairs of opposing walls 152. The pairs of walls 152 are joined as shown in FIG. 5 to define a rectangular cross-section. FIG. 6 shows the tops 154 of each of the walls 152 meeting and forming an air-tight seal with the top panel 124 of the housing 116 adjacent to the opening 122. The top panel 124 thus suspends the walls 152 of the enclosure 118. The enclosure 118 defines a three-dimensional volume having a height H (FIG. 4A) from the upper surface 146 of the fluid 134 to the top panel 124 of the housing 116. The volume has a length L and a width W shown in FIG. 5 sufficient to allow the wafer(s) 102 and the carrier 110 to move into and through the volume of the enclosure 118. FIGS. 5 and 6 show the walls 152 of the enclosure 118 provided with gas inlets 156 connected to pipes 158. Gas 157 (see arrows 157) admitted to the enclosure 118 through the gas inlets 156 may be an inert gas. The gas 157 is preferably nitrogen, and more preferably is heated nitrogen. Most preferably, the heated nitrogen gas 157 is admitted into the enclosure 118 through the gas inlets 156 under pressure, such as thirty to fifty psi (static). The anti-static device 119 (FIG. 2) admits nitrogen to the enclosure through an anti-static inlet 159. The device 119 creates a charge at the point at which the nitrogen is introduced into the inlet 159 to prevent static charge from existing in the enclosure 118.

Each of the walls 152 has a lower end or bottom 160 that is spaced from the upper surface 146 of the fluid 134 by a distance O (FIG. 4B). The spaced lower ends 160 define the primary gas outlet 144 as an elongated gas outlet from the enclosure 118. The elongated outlet 144 is beneath each of the four walls 152 of the enclosure 118. Arrows F in FIGS. 4A and 6 show the flow paths of the gas 157 flowing into the enclosure 118 from the gas inlets 156 and then flowing across the opposite sides of the wafer(s) 102 and along the upper surface 146 before exiting the enclosure 118 through the elongated gas outlet 144. The walls 152 of the enclosure 118 and outer walls 163 that surround the enclosure 118 define a secondary gas outlet 162 of a gas outflow chamber 164. The gas exiting through the elongated gas outlet 144 flows into the outflow chamber 164 to the secondary outlet 162.

A plenum 166 surrounding the enclosure 118 and the bath 112 is defined by the walls 163 and outer walls 168 of the housing 116, and receives the gas exiting through the secondary outlet 162 from the outflow chamber 164. The outer housing walls 168 are laterally spaced from the walls 138 of the bath 112 and are more laterally spaced from the walls 163 of the chamber 164. The plenum 166 is closed by a lower plate 170 extending between the walls 163 of the chamber 164 and the outer walls 168 of the housing 116. The secondary outlet 162 admits the gas 157 to the plenum 166 from the outflow chamber 164, and the gas 157 is pulled from the plenum 166 and through and from the outflow chamber 164 and from the enclosure 118 by fans 172.

Figure 7:
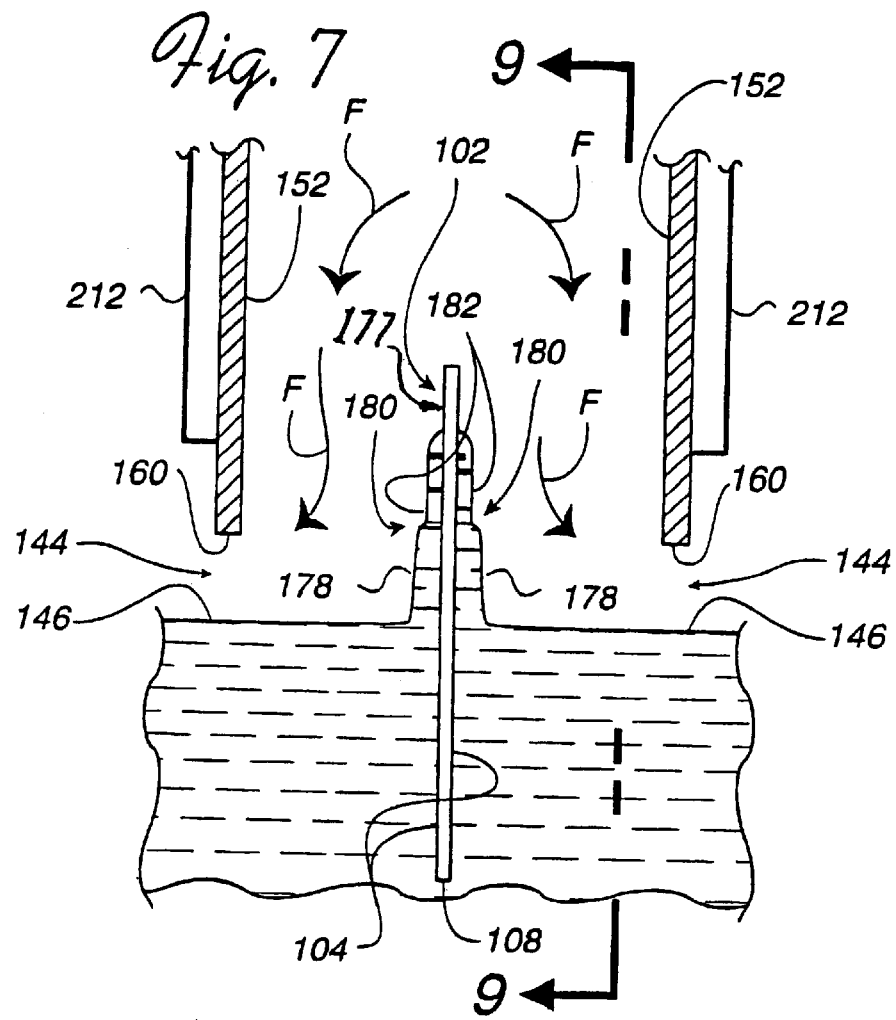
FIG. 7 is an enlarged view of a portion of FIG. 6 showing that by controlling the rate at which the wafer is removed from the bath a meniscus will form on each side of the wafer, and above the meniscus a uniform thin film will remain to be dried off the wafer according to the present invention.
Figure 8:
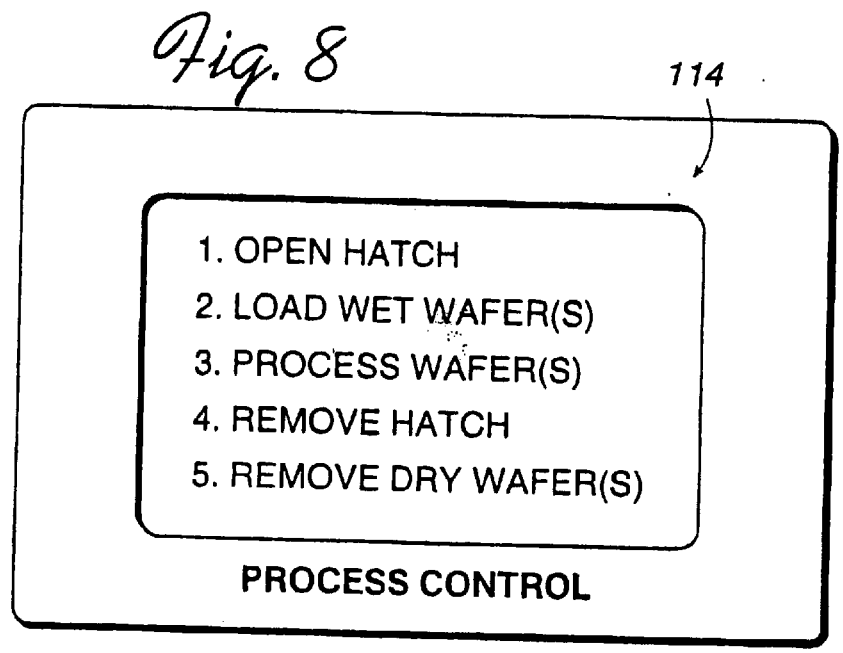
FIG. 8 is a diagram of a control panel for operating the apparatus.

The pressure at which the gas 157 is admitted into the enclosure 118 and the operation of the fans 172 combine to direct the heated gas 157 so that the flow paths F are continuous. As shown in FIGS. 4A, 6, and 7, with the wafer(s) 102 positioned in, or partially in, the enclosure 118, the flow paths F of the gas 157 are directed into the enclosure 118 from the gas inlets 156, flow in the enclosure 118 across the opposite sides 104 of the wafer(s) 102, flow along the upper surface 146, flow through the primary gas outlet 144, flow through the outflow chamber 164 and through the outlet 162, and flow through the plenum 166, exiting the plenum 166 by way of the fans 172. In this manner, the gas 157 admitted into the enclosure 118 does not stagnate in or otherwise accumulate in the enclosure 118. Described differently, FIG. 4B schematically depicts many successive small volumes 174 (shown in dashed lines) of the gas 157 input to the enclosure 118. One such small volume 174 will flow (arrow F) continuously from the respective gas inlet 156 and along the above-described continuous flow path F through the enclosure 118 through the outflow chamber 164, and through the plenum 166 to the ambient air outside the housing 116.

FIGS. 2 and 4B show the arm 128 that mounts the carrier 110 for movement relative to the housing 116, and thus relative to the enclosure 118 and the bath 112 within the housing 116. A stepper motor 176 is mounted on the housing 116. Alternatively, a servo motor (not shown) may be used. The stepper motor 176 is designed to move the carrier 110 from the initial position shown in FIG. 2 above the top panel 124 of the housing 116. At this initial position, the carrier 110 is out of the enclosure 118 and the bath 112, so that wafer(s) 102 may be inserted into the grooves 126. The wafer(s) 102 are generally somewhat wet from a previous processing operation, but the material (not shown) that wets the wafer(s) 102 may be on the planar sides 104 and the edge 108 of the wafer(s) 102 in a non-uniform manner. The stepper motor 176 is also designed to quickly move the arm 128, and thus the carrier 110 and the wafer(s) 102 on the carrier 110, through the opening 122, into and through the enclosure 118, and into the fluid 134 in the bath 112 to immerse the carrier 110 and the wafer(s) 102 in the fluid 134 as described above. When immersed in the fluid 134, the planar sides 104 and the edges 108 of the wafer(s) 102 are now not only wet in a uniform manner, but wet by the very clean, filtered and heated fluid 134 to condition the wafer(s) 102 for being dried.

Figure 9:
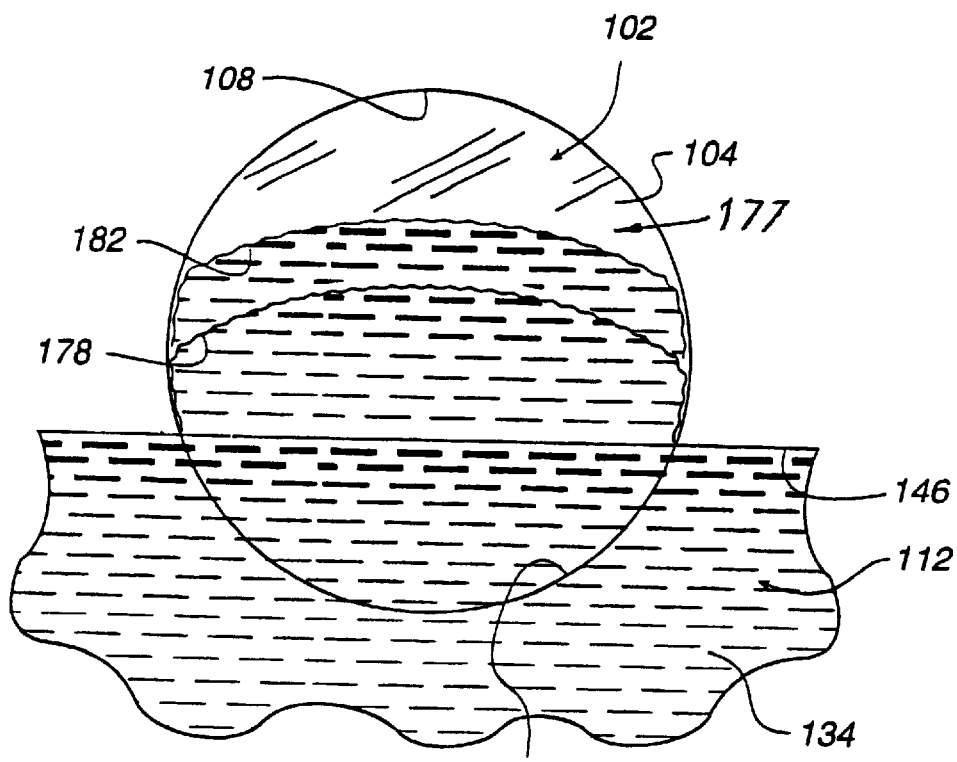
FIG. 9 is an enlarged partial side elevational view taken along line 9—9 in FIG. 7 showing a planar side of the wafer with the meniscus formed, and with the uniform thin film remaining on the wafer above the meniscus.

Importantly, the stepper motor 176 is also designed to move the arm 128 upwardly as shown in FIGS. 4B, 7 and 9, to separate the wafer(s) 102 and the bath 112. Such separation is preferrably by moving the carrier 110 and the wafer(s) 102 upwardly out of the bath fluid 134. Such movement results in an increasingly large portion 177 of the wafer(s) 102 being out of the fluid 134. As shown in detail in FIGS. 7 and 9, however, as the wafer(s) 102 moves out of the fluid 134, a meniscus 178 (shown by a dash-dot-dash line) is formed between the upper fluid surface 146 and each of the opposite planar sides 104 of the wafer 102. The meniscus 178 extends upwardly from the upper surface 146 and is in effect a localized vertically extending section of the fluid 134 located above the upper surface 146. The meniscus 178 terminates at a rounded nose 180 (FIG. 7). Additionally, as the wafer(s) 102 is moved upwardly and are separated from the fluid 134, a thin film, or monolayer, 182 (shown by a dash-dot—dot line), of the fluid 134 forms and is retained on each side 104 of the wafer(s) 102 above the meniscus 178. The formation of the meniscus 178, and the resulting thin film 182 retained on the sides 104 of the wafer 102, are desirable in that the thin films 182 of the fluid 134 on the planar sides 104 are of uniform thickness, and promote efficient removal of the thin film 182 according to the present invention. As a result, each portion 177 of the side 104 having the thin film 182 thereon is uniformly wet by the fluid 134.

To increase the number of wafer(s) 102 that may be processed per hour using the apparatus 100 and methods of the present invention, a rate of upward movement of the stepper motor 176 may be selected over a range of from one to six inches per minute. This rate of movement is selected according to the characteristics of the (a) wafer(s) 102 that are to be carried in the carrier 110, and (b) fluid 134 in the bath 112. More particularly, for each combination of wafer (s) 102 and fluid 134, there is a maximum rate of movement of the wafer(s) 102 out of the bath 112 at which the meniscus 178 and the thin film 182 of fluid 134 will form on each side 104 of the wafer(s) 102. It is undesirable for the stepper motor 176 to move the carrier 110 out of the bath 112 at a rate greater than this maximum rate of movement of the wafer(s) out of the bath. In detail, if this rate is exceeded, then the meniscus 178 may not form and any fluid 134 retained on the wafer 102 as the wafer 102 exits the fluid 134 may be non-uniform, such as not extending completely across the wafer 102 or being non-uniform in thickness. Such non-uniform fluid 134 may evaporate non-uniformly and may leave an unacceptable level of residue and stains.

Figure 10:
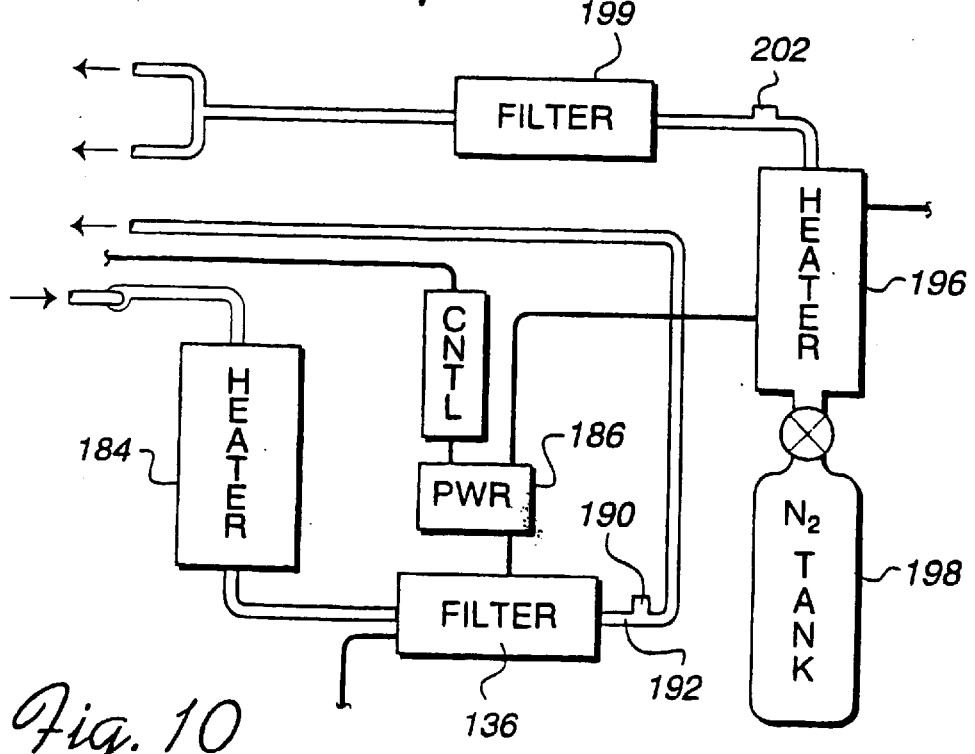
FIG. 10 is a schematic diagram of a system for supplying fluid, gas, and power to the apparatus for drying wafers.

Efficient removal of the fluid 134 from the wafer(s) 102 is achieved by the transfer of thermal energy to the wafer(s) 102 and to the thin film 182 of fluid 134 as the wafer(s) 102 and the bath 112 are separated. As described above, such separation is preferably by moving the wafer(s) 102 from the bath 112 into and through the enclosure 118. An initial input of thermal energy to the wafer(s) 102 is from the heated fluid 134 in the bath 112. FIG. 10 shows that after the fluid 134 exits from the bath 112 a pump 183 directs the fluid 134 through a heater 184 that is supplied with energy by a power supply 186. The heater 184 may be an electrical resistance heater, for example, and the power supply 186 may supply 110V or 220V to the heater 184. The temperature to which the heater 184 heats the filtered fluid 134 may be adjusted based on the reading of a "DI PROCESS TEMP" gauge 188 on the operating panel 114, where "DI" indicates that the fluid 134 may be de-ionized water. The DI TEMP gauge 188 has a temperature sensor 190 attached to an outlet 192 of the filter 136. The heater 184 heats the fluid 134 so that the temperature of the fluid 134 in the bath 112 is a preferred temperature, such as in the range from 160 degrees F. to 190 degrees F. More preferably, the temperature of the fluid 134 in the bath 112 is in the range from 175 degrees F. to 185 degrees F. Most preferably, the temperature of the fluid 134 in the bath 112 is in the range from 178 degrees F. to 185 degrees F. For convenience, a "DI PROCESS TEMP LIMIT" gauge 194 is provided on the operating panel 114 to indicate whether the temperature of the fluid 134 in the bath 112 exceeds a preferred temperature. After the fluid 134 is heated the fluid flows through the filter 136 for return to the bath 112.

As described below, during a wafer-drying cycle, the wafer(s) 102 are immersed in the fluid 134 in the bath. The period of time of immersion is selected so as to transfer thermal energy to the wafer(s) 102 sufficient to provide, at the time the carrier 110 starts to move the wafer(s) 102 out of the bath 112, a temperature of the surface of the wafer(s) 102 about the same or somewhat lower than the temperature of the fluid 134 adjacent to the upper surface 146 of the bath 112. In particular, the surface temperature of the wafer 102 may be from about 160 degrees F. to about 190 degrees F. More preferably, such temperature of the wafer(s) 102 may be in the range from about 175 degrees F. to about 185 degrees F. Most preferably, such temperature of the wafer (s) 102 is in the range from about 178 degrees F. to about 185 degrees F.

A further input of thermal energy to the wafer(s) 102, and to the thin films 182 on the wafer(s) 102, is from the heated gas 157 flowing in the enclosure 118. In particular, FIG. 10 shows that the gas 157 receives thermal energy from a gas heater 196 connected to a gas tank 198, such as a nitrogen tank containing nitrogen under pressure, such as eighty psi.(static). The gas heater 196 is supplied with energy from the power supply 186. The heater 196 may be an electrical resistance heater, for example. The temperature to which the gas heater 196 heats the gas 157 may be adjusted based on the reading of an "N2 PROCESS TEMP" gauge 200 on the operating panel 114. The N2 PROCESS TEMP gauge 200 has a temperature sensor 202 attached to an outlet of the gas heater 196. The gas heater 196 heats the gas so that the temperature of the gas 157 entering the enclosure 118 is a preferred temperature, such as in the range from 260 degrees F. to 400 degrees F. More preferably, the temperature of the gas 157 entering the enclosure 118 is in the range from 290 degrees F. to 360 degrees F. Most preferably, the temperature of the gas 157 entering the enclosure 118 is in the range from 315 degrees F. to 350 degrees F. For convenience, a "N2 PROCESS TEMP LIMIT" gauge 204 is provided on the operating panel 114 and is connected to a temperature sensor 206 to indicate whether the temperature of the gas 157 entering the enclosure 118 exceeds the preferred temperature. From the heater 196 the heated gas 157 flows through a filter 199. The gas heater 196 assures that as the gas 157 initially enters the enclosure 118 through the gas inlets 156, the gas 157 is at a high enough temperature to transfer thermal energy to the wafer(s) 102 and to the thin films 182 on the wafer(s) 102 as described below. A "N2 TEMP IN CHAMBER" gauge 208 is provided on the control panel 114 for indicating the temperature of the gas 157 in the enclosure 118, as sensed by a temperature sensor 210, and facilitates adjustment of the gas heater 196.

A further input of thermal energy to the wafer(s) 102, and to the thin films 182 the wafer(s) 102, is from the enclosure 118. FIG. 7 shows that the walls 152 of the enclosure 118 are provided with flat heaters 212 that maintain the temperature of the walls 152 from about 160 degrees F. to about 400 degrees F. More preferably, such temperature of the walls 152 is in the range from about 190 degrees F. to about 300 degrees F. Most preferably, such temperature of the walls 152 is in the range from about 220 degrees F. to about 250 degrees F. The wall temperature, i.e., the temperature to which the heater 212 heats the walls 152, may be adjusted based on the reading of a "CHAMBER TEMP HEATER" gauge 214 on the operating panel 114. The CHAMBER TEMP HEATER gauge 214 is connected to a temperature sensor 216 attached to one of the walls 152 of the enclosure 118. Readings of the CHAMBER TEMP HEATER gauge 214 facilitate adjusting the power to the enclosure heater 212.

With the walls 152 of the enclosure 118 at the selected temperature, the gas 157 flowing in one or more of the continuous flow paths F in the enclosure 118 may contact the walls 157 and receive thermal energy. In this manner, upon contact of the gas 157 with the walls 152, the temperature of the gas 157 in the continuous flow paths F is maintained at a preferred temperature. This preferred temperature is about from about 160 degrees F. to about 210 degrees F. More preferably, such temperature of the flowing gas 157 is in the range from about 176 degrees F. to about 200 degrees F. Most preferably, such temperature is in the range from about 185 degrees F. to about 196 degrees F.

With the walls 152 of the enclosure 118 at the selected temperature, the walls 152 also transfer radiant thermal energy to the wafer(s) 102 and to the thin films 182 on the wafer(s) 102 as the wafer(s) 102 are moved from the bath 112 into and through the enclosure 118. The radiant thermal energy helps assure that the temperature of the wafer(s) 102 and of the thin films 182 on the wafer(s) 102 does not decrease as the wafer(s) 102 are moved from the bath 112 into and through the enclosure 118. Master control of the stepper motor 176, and of the heaters 184, 196 and 212, is via a power ON/OFF switch 218 or an emergency switch 220, each of which controls the power supply 186.

Figure 11:
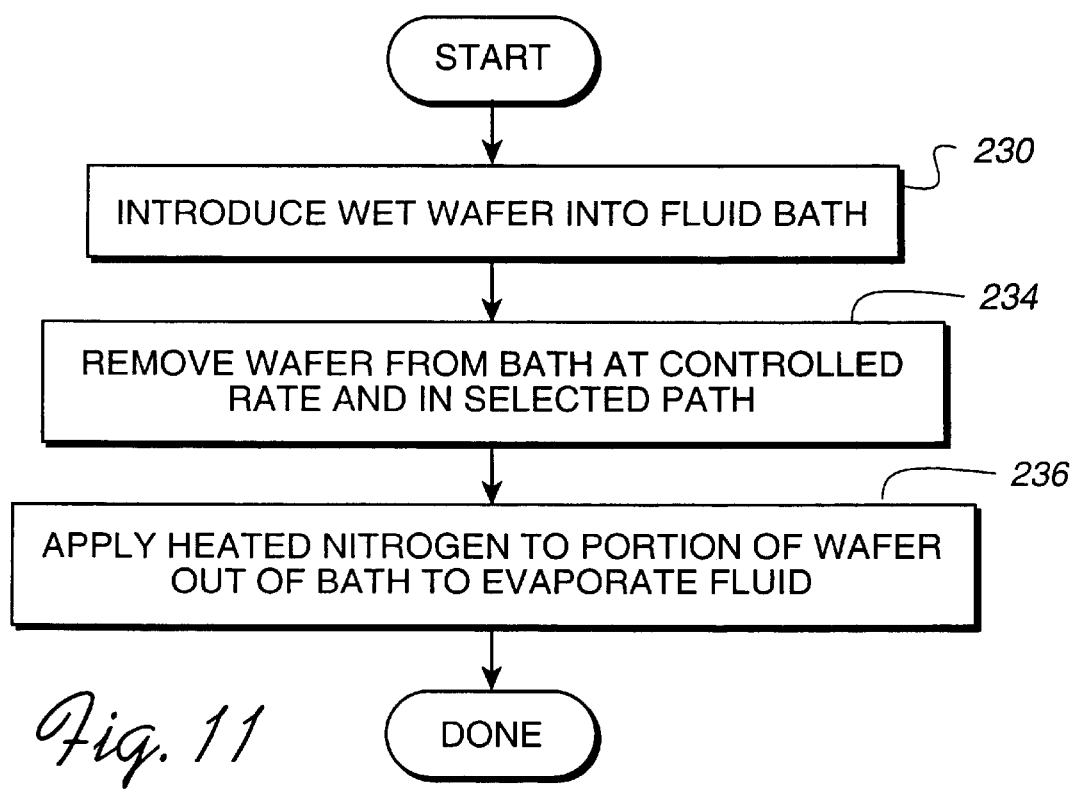
FIG. 11 is a diagram of a flow chart illustrating operations in one embodiment of a method for drying wafers according to the principles of the present invention.

FIG. 11 shows a flow chart illustrating operations of one embodiment of a method for drying the wafer(s) 102 according to the principles of the present invention. A wafer drying cycle of the method starts by an operation 230 of introducing the wafer(s) 102 into the fluid bath 112. As described below, the wafer(s) 102 are generally received somewhat wet from the previous processing operation, but the material that wets the wafer(s) 102 is not on the planar sides 104 of the wafer(s) 102 in a uniform manner. The process control panel 114 provides an instruction "1" to open the hatch, and the hatch 120 is removed to expose the opening 122 in the housing 116. The heater 184 for the fluid 134 is turned on and the temperature of the fluid 134 is set as described above. The carrier 110 is positioned by the stepper motor 176 in the UP position, out of the enclosure 118 to expose the grooves 126 to receive the wafer(s) 102.

As appropriate, the next process control instruction "2" (LOAD WET WAFERS) is followed by inserting one or more wafer(s) 102 into the grooves 126 of the carrier 110. With the hatch 120 still removed, the carrier 110 with the wafer(s) 102 loaded thereon is moved by the stepper motor 176 downwardly at a relatively rapid rate to lower the wafer(s)102 into the fluid 134 in the bath 112. The carrier 110 is lowered until the carrier 110 is in a DOWN position, located adjacent to the bottom 140 of the bath 112 with the wafer(s) 102 on the carrier 110 fully immersed in the fluid 134. At this time, the hatch 120 is placed on the top panel of the housing to close the enclosure 118, and operation 230 is complete.

Operation 234 performs the next instruction "3" on the process control panel 114. Instruction "3" is PROCESS WAFERS. Operation 234 is performed by turning on the heater 212 for the enclosure 118, and the temperature of the walls 152 is set as described above. Also, the DIW heater 184 and the gas heater 196 are turned on and set as described above. According to the characteristics of the wafer(s) 102 and of the fluid 134, the process control panel 114 controls the rate of upward movement of the stepper motor 176 so that such rate is the maximum rate of movement of the wafer(s) 102 out of the fluid 134 at which the meniscus 178 and the thin film 182 of fluid 134 will form on the sides 104 of the wafer(s) 102. Such rate may be referred to as a controlled rate, for example. The carrier 110 moves the wafer(s) 102 along the selected (wafer drying) path 132 in the enclosure 118, which is a vertical path.

As the wafer(s) 102 is moved out of the bath 112, operation 236 is performed by flowing the hot nitrogen gas 157 in the flow path F to apply the nitrogen 157 to the uniformly wet portion(s) 177 of the wafer(s) 102 that are out of the fluid 134. The hot nitrogen 157, in combination with the thermal energy from the walls 152 of the enclosure 118, keep the wafer(s) 102 and the thin films 182 at the desired temperature for evaporating the thin films 182 from the opposing sides 104 of the wafer(s) 102. Because the height H of the enclosure 118 is selected so as to provide adequate distance in which the wafer(s) 102 move as the thin films 182 are evaporated from the sides 104, all of the fluid 134 of the thin films 182 is evaporated from the sides 104 of all of the wafer(s) 102 before the wafer(s) 102 reach the top panel 124 of the housing 116. Operation 236 is completed by performing instruction "4" to remove the hatch 120 and instruction "5" to remove the dry wafer(s) 102 from the carrier 120. The method described in FIG. 11 is thus DONE.

Figure 12:
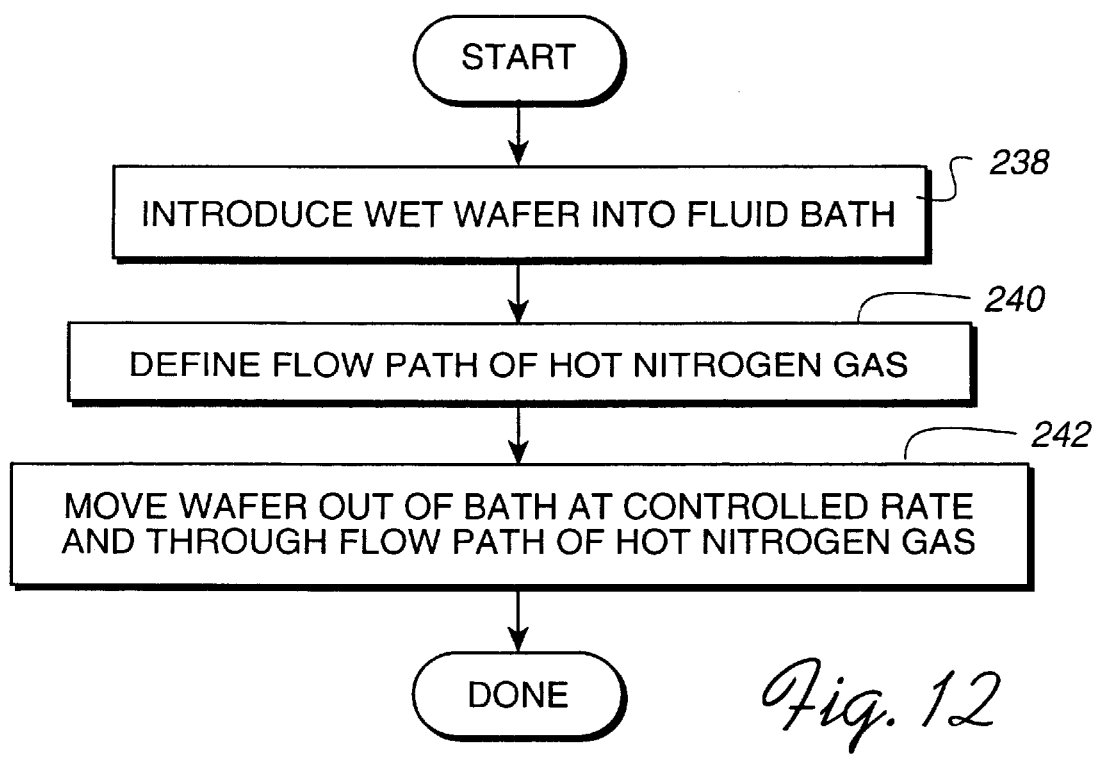
FIG. 12 is a diagram of a flow chart illustrating operations in another embodiment of a method for drying wafers according to the principles of the present invention.

FIG. 12 shows a flow chart illustrating operations of another embodiment of a method for drying the wafer(s) 102 according to the principles of the present invention. A wafer drying cycle of the method starts by an operation 238 of introducing the wafer(s) 102 into the fluid bath 112, which is essentially the same as operation 230 described above.

The next instruction on the process control panel is "3", PROCESS WAFERS, which is performed in operations 240 and 242. In operation 240, the flow path F of the hot nitrogen gas 157 is defined. The defining operation 240 may be performed by providing the closed enclosure 118 as described above, including for example the gas inlet(s) 156, the primary outlet 144, and the secondary outlets 162. Operation 240 also provides the plenum 166 and the fan(s) 172. The hot nitrogen 157 is supplied from the tank 198 and the gas heater 196 to the gas inlet(s) 156. The temperature of the hot nitrogen 176 is set as described above. The fan(s) 172 are turned on. In this manner, the flow paths F of hot nitrogen 176 are established in the enclosure 118. As described above, each of the flow paths F is from the gas inlet 156, across the opposite sides 104 of the wafer(s) 102, along the upper surface 146 of the fluid 134, through the primary gas outlet 144, through the outflow chamber 164, through the secondary outlet 162, and through the plenum 166, exiting the plenum 166 by way of the fans 172. By each such flow path F, which is continuous, the flow of gas 157 admitted into the enclosure 118 does not stagnate in the enclosure 118, or become discontinuous, or otherwise accumulate in the enclosure 118. With the flow path F defined the "3" instruction (PROCESS WAFER(S) continues by performing operation 242 in which the wafer(s) 102 is moved out of the bath 112 at a controlled rate and through the flow paths F of hot nitrogen gas 157. The heater 212 for the enclosure 118 is turned on and the temperature of the walls 152 is set as described above. According to the characteristics of the wafer(s) 102 and of the fluid 134, the process control panel 114 controls the rate of upward movement of the stepper motor 176 so that such rate is the maximum rate of movement of the wafer(s) 102 out of the bath 112 at which the meniscus 178 and the thin film 182 of fluid 134 will form on the sides 104 of the wafer(s) 102. Such rate may be referred to as a controlled rate, for example.

As the wafer(s) 102 is moved out of the bath 112, the hot nitrogen 157 flowing in the flow paths F keeps the wafer(s) 102 and the thin films 182 at the desired temperature for evaporating the thin films 182 from the opposing sides 104 of the wafer(s) 102 as the wafer 102 exits the fluid 134. Because the height H of the enclosure 118 is selected so as to provide adequate distance in which the wafer(s) 102 may move as the thin films 182 are evaporated from the sides 104, and because the fluid 134 of the thin films 182 is rapidly evaporated from the sides 104 of all of the wafer(s) 102, the evaporation is complete before the wafer(s) 102 reach the top panel 124 of the housing 116. Further, via control of the speed of the fans 172 and hence control of the rate of flow of the gas 157 in the continuous flow paths F, the continuous flow paths F control the relative humidity in the enclosure 118 by causing the fluid 134 evaporated from the wafer 102, and causing any fluid 134 that has vaporized from the bath 112, to directly exit the enclosure 118 and not remain in the enclosure 118 for respective possible recondensation or condensation on the wafer 102. Such control may provide relative humidity in the enclosure 118 under about forty percent, and more preferably from about forty percent to about thirty percent. Most preferably, the relative humidity may be about thirty percent. Thus, by controlling the relative humidity in the hot enclosure 118, recondensation of the evaporated thin film 182 and condensation of vapor from the bath 112 onto the wafer 102 are inhibited.

The stepper motor 176 is then stopped, and the next instruction "4", REMOVE HATCH, is performed to open the opening 122. To complete operation 242, the next instruction ("5") on the process control panel, REMOVE DRY WAFER(S), is performed. The now-dry wafer(s) 102 are removed from the carrier 110, and the carrier 110 is thus ready to be loaded with wafer(s) 102 for the next drying operation. The method described in FIG. 1 is thus DONE.

As noted, prior to the present invention, there was a need for apparatus and methods of efficiently drying the wafer(s) 102. The efficient drying resulting from use of the present invention allows the wafer(s) 102 to be separated from the fluid 134 at the described selected rate which is no less than the maximum rate at which the thin film 182 and the meniscus 178 will form between the fluid bath 134 and the sides 104 of the wafer 102. As a result, the overall period of time taken in the typical drying cycle described with respect to FIG. 12 may not exceed about two minutes. To not exceed such time period, the drying cycle rapidly removes from the wafer(s) 102 the thin films 182 of the fluid 134 that are uniformly formed on the sides 104 of the wafer(s) 102 as the wafer(s) 102 and the bath 112 are separated. As described above, "rapidly" means that such removal occurs before the wafer(s) 102 and the bath 112 have been separated enough to have the top of the wafer(s) 102 hit the top panel 124 of the housing 116 as the carrier 110 moves upwardly in the enclosure 118.

In review, then, the present invention fills these needs by providing the apparatus 100 and the described methods of efficiently removing the fluid 134 from the wafers 102. The efficient removing uniformly wets the wafer(s) 102 in the fluid bath 112, so that a consistent starting condition of the wafers 102 is provided regardless of the type of prior processing of the wafer(s) 102. In addition, the efficient removing is attained by defining a gas-filled volume, which is provided by the hot enclosure 118 that continuously transfers thermal energy to the wafer(s) 102 in the volume. The wafer(s) 102 and the bath are separated at the controlled rate to form the thin films 182 of fluid 134 on the wafer(s) 102 as the wafer(s) 102 are positioned in the gas-filled volume defined by the enclosure 118. Further, the hot gas 157 directed into the volume and across the wafer(s) 102 and out of the volume continuously transfers thermal energy to the wafer(s) 102. Since the fluid 134 is not drained from the bath 112 to enable flow of the gas 157 from the enclosure 118, for example, the directing of the hot gas 157 out of the volume is not only continuous, but independent of the separation of the bath 112 and the wafer 102. With the thin films 182 formed uniformly on the planar sides 104, and with the thin films 182 provided with thermal energy as the wafers move up in the enclosure, the thermal energy transferred to the wafer(s) 102 in the volume rapidly evaporates the thin film 182 from the wafer 102 without decreasing the rate of separation of the wafer 102 and the bath 112 below the maximum rate of such separation at which the meniscus 178 will form between the bath 112 and the sides 104 of the wafer 102 during such separation. As described, such efficient removing enables the wafer throughput of such apparatus 100 and method to be limited only by the type of wafer 102 that is being dried, and the type of fluid 134 used to wet the wafer 102. Thus, reliance is not placed on the thermal energy stored in a given wafer 102 to provide all of the thermal energy necessary to evaporate fluid 134 from the wafer 102. Such efficient removing also involves controlling the relative humidity in the enclosure 118 to be low to inhibit recondensation of the fluid 134 on the wafers 102. Therefore, the described problems with the prior art dryers are avoided.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A wafer drying system, comprising:
    a bath enclosure configured to hold a fluid, the fluid defining a top fluid surface; and
    a temperature-controlled drying chamber having a bottom defined by the top fluid surface, the chamber having a wall structure provided with a first gas exhaust opening proximate to the top fluid surface and a second gas inlet opening spaced above the first gas exhaust opening to define a continuous flow of gas from the second gas inlet opening down through the chamber, across the top fluid surface, and out of the first gas exhaust opening.

2. A system according to claim 1, wherein the chamber wall structure extends from proximate to the top fluid surface to the second gas inlet opening; further comprising:
    a heater for maintaining the wall structure at a selected temperature so as to transfer thermal energy into the chamber and to a wafer exiting the bath.

3. A system according to claim 1, further comprising:
    a hot gas supply connected to the second gas inlet opening for providing a flow of hot gas in the continuous gas flow path flowing into and through the chamber, across the top fluid surface into contact with a wafer exiting the bath, and out of the first gas exhaust opening, and away from the top fluid surface.

4. A system according to claim 1, wherein the wafer has opposite planar sides that are parallel to a planar axis; the system further comprising:
    a wafer transport unit for immersing the wafer in the fluid with the planar axis generally perpendicular to the fluid surface; and
    the wafer transport unit comprising a drive to move the wafer from the fluid with the planar axis positioned generally perpendicular to the fluid surface, the drive moving the wafer at a controlled rate into the chamber to a position between the first gas exhaust opening and the second hot gas inlet opening, the drive rate being controlled to permit formation of a meniscus between the top fluid surface and each of the opposite planar sides of the wafer and formation of a thin layer of fluid above the meniscus on a portion of each of the planar sides, each of the portions being out of the fluid.

5. A system according to claim 4, the system further comprising:
    a heat transfer unit for transferring thermal energy to the portions of the wafer and to the thin layers as the wafer is moved at the controlled rate into the chamber.

6. A system according to claim 5, the heat transfer unit further comprising:
    a hot gas supply connected to the second gas inlet opening for providing the continuous flow of gas down through the chamber and across the portion of each of the opposite planar sides of the wafer and across the portion of the top fluid surface and out of the chamber through the first gas exhaust opening to transfer thermal energy at a selected temperature to the thin layer on each portion to assist in evaporating the thin layer from each portion.

7. A system according to claim 5, the heat transfer unit further comprising:

a heater connected to the chamber between the first and second openings for transferring thermal energy to the chamber.

8. A system according to claim 4, further comprising:

a hot gas supply connected to the second gas inlet opening for flowing hot gas down through the chamber across the portion of each of the opposite planar sides of the wafer and across the top fluid surface and out of the chamber through the first gas opening to continuously transfer thermal energy at a selected temperature to the thin layer on each portion to assist in evaporating the thin layer from each portion; and a heater connected to the chamber between the first and second openings for transferring thermal energy into the chamber to the thin layer on each of the portions as the wafer is moved at the controlled rate in the chamber;

the thermal energy from the hot gas and from the chamber being effective to evaporate the thin layer of fluid from the portion of each of the opposite planar sides of the wafer.

9. Apparatus according to claim 8, further comprising:

a control system for assuring that the hot gas supply and the heater are operating within selected temperature limits, the control system controlling operation of the drive.

10. Apparatus for drying a wafer having opposite planar sides, the apparatus comprising:

a bath for containing a fluid, the fluid defining an upper surface;

a heat transfer chamber having a plurality of walls, each of the walls having a bottom at generally the same level as the level of a bottom of an adjacent one of the walls, the chamber defining a wafer drying volume extending upwardly from the upper fluid surface and within which a wafer drying path extends, at least one of the walls being provided with a gas inlet positioned spaced from the respective bottom;

a support for suspending the chamber above the bath with the wafer drying path extending from the gas inlet and extending immediately above the upper fluid surface, the support positioning the bottoms of the chamber walls immediately above the upper fluid surface to define an elongated gas exhaust outlet extending around a portion of the wafer drying path, the support suspending the chamber to define the wafer drying path as extending from immediately above the upper fluid surface to the gas exhaust outlet;

a hot gas supply connected to the gas inlet to flow hot gas in the wafer drying path downwardly through the chamber across the opposite planar sides of the wafer and out of the chamber through the elongated outlet to continuously transfer thermal energy at a selected temperature across the wafer drying path; and a heater connected to the chamber between the gas inlet and the elongated gas exhaust outlet for radiating thermal energy across the wafer drying path.

11. A method for drying a wafer, comprising the operations of:

introducing a wafer being in a wet state into a fluid bath;

removing the wafer from the fluid bath at a controlled rate along a selected path; and applying heated gas to the wafer as the wafer is moved through the upper surface and out of the fluid bath, the applied heated gas being in at least one continuous flow path from above the wafer and to and across the wafer and across the upper surface without recirculating the heated gas to the wafer, the applied heated gas assisting a transition of the wafer to a dry state during the removing operation.

12. A method according to claim 11, further comprising the operation of:

radiating thermal energy onto the wafer as the wafer moves through the upper surface and out of the fluid bath.

13. A method according to claim 11, wherein the heated gas is hot nitrogen, the applying operation further comprising the operations of:

providing an enclosure defining the at least one continuous flow path;

flowing the hot nitrogen in the one at least one continuous flow path across the wafer as the wafer is moved through the upper surface and out of the fluid bath to effect the transition by evaporating the fluid from the wafer into the hot nitrogen; and removing the hot nitrogen and the evaporated fluid away from the wafer along the upper surface of the fluid bath and out of the enclosure.

14. A method according to claim 11, wherein the controlled rate of the removing operation is selected to provide a thin film of the fluid on the wafer; and the applying operation assists in evaporating the thin film from the wafer as the wafer moves through the upper surface and out of the fluid bath.

15. A method according to claim 11, wherein the operation of applying heated gas to the wafer further comprises:

controlling the relative humidity of the heated gas and any vaporized fluid as the wafer is moved along the selected path and out of the fluid bath.

16. A method for drying a wafer, comprising the operations of:

immersing a wafer in a fluid bath to wet opposite sides of the wafer with the fluid;

moving the wafer from the fluid bath into a defined volume, the rate of moving of the wafer being selected to form a meniscus on each of the opposite sides and a thin film of the fluid above the meniscus on the respective opposite sides of the wafer as the wafer moves from the fluid into the defined volume;

flowing heated gas along the wafer as the wafer is moved along the selected path from of the fluid to assist in the evaporation of the thin film of the fluid from the wafer; and exhausting from the defined volume the evaporated thin film and the gas.

17. A method according to claim 16, wherein the wafer has opposite surfaces, and wherein:

the immersing operation includes positioning a plurality of wafers in the fluid bath to wet the opposite sides of each of the wafers with the fluid;

the moving operation includes moving the wafers along the selected path parallel to the sides of the wafers; and the flowing operation includes flowing the heated gas along each of the sides of each of the wafers; and the exhausting operation removes the evaporated thin films and the gas from the wafers for flow across the upper surface of the fluid and from the defined volume at a location proximate to an upper surface of the fluid in the bath.

18. A method according to claim 16, wherein the selected rate is not more than a maximum rate at which the meniscus and the thin film will form on the opposite sides of the wafer as the wafer moves from the fluid bath.

19. A method according to claim 18, wherein the selected rate is in a range from about one inch per minute to about six inches per minute.

* * * * *